United States Patent
Tsai et al.

(10) Patent No.: US 7,109,652 B2
(45) Date of Patent: Sep. 19, 2006

(54) TOP EMISSION LIGHT EMITTING DISPLAY HAVING REFLECTIVE LAYER

(75) Inventors: Yaw-Ming Tsai, Chu-Nan (TW); Shih-Chang Chang, Chu-Nan (TW)

(73) Assignee: TPO Displays Corp., Chu-Nan (TW)

( * ) Notice: Subject to any disclaimer, the term of this patent is extended or adjusted under 35 U.S.C. 154(b) by 237 days.

(21) Appl. No.: 10/690,636

(22) Filed: Oct. 23, 2003

(65) Prior Publication Data

US 2004/0080476 A1    Apr. 29, 2004

(30) Foreign Application Priority Data

Oct. 23, 2002    (CN) .............................. 91 1 24581

(51) Int. Cl.
*H01J 1/62*    (2006.01)
(52) U.S. Cl. ...................... 313/506; 313/504
(58) Field of Classification Search .............. 313/506, 313/110, 112–113, 512, 504; 315/169.3; 257/40; 428/690, 917
See application file for complete search history.

(56) References Cited

U.S. PATENT DOCUMENTS

| | | | |
|---|---|---|---|
| 5,834,893 A * | 11/1998 | Bulovic et al. ............. | 313/506 |
| 6,366,017 B1 | 4/2002 | Antoniadis et al. | |
| 2004/0012980 A1* | 1/2004 | Sugiura et al. ............. | 362/560 |
| 2004/0070335 A1* | 4/2004 | Cok ........................... | 313/506 |
| 2004/0070709 A1* | 4/2004 | Kanou et al. ............... | 349/113 |
| 2004/0183437 A1* | 9/2004 | Lee ............................ | 313/506 |

* cited by examiner

*Primary Examiner*—Joseph Williams
*Assistant Examiner*—Bumsuk Won
(74) *Attorney, Agent, or Firm*—Nixon Peabody LLP; Donald R. Studebaker

(57) ABSTRACT

A top emission organic light emitting display with a reflective layer therein is provided. The reflective layer, a first electrode, an organic layer, and a transparent second electrode are subsequently formed on the substrate. When a bias voltage is applied to the first electrode and the transparent second electrode, the organic layer emits radiation. The reflective layer reflects radiation from the organic layer toward the transparent second electrode, and therefore the emission efficiency of the OLED increases.

10 Claims, 3 Drawing Sheets

TOP EMISSION LIGHT EMITTING DISPLAY HAVING REFLECTIVE LAYER

CROSS REFERENCE TO RELATED APPLICATIONS

This application claims priority of Taiwan Patent Application Serial No. 91124581 entitled "Top Emission Light Emitting Display with Reflective Layer", filed on Oct. 23, 2002.

FIELD OF INVENTION

The present invention relates to a light emitting display, and more particularly, to an organic light emitting display having a reflective layer to improve emission efficiency.

BACKGROUND OF THE INVENTION

As technologies progress, an organic light emitting display (OLED) has become one of the most potential future displays. A conventional OLED includes a metal cathode and a transparent anode, and an organic layer is interposed between the cathode and the anode. The metal cathode is made of metal having a low work function, such as Mg, Al or alloy thereof while the transparent anode is made of Indium Tin Oxide (ITO) or Indium Zinc Oxide (IZO). Light exits from the organic layer through the transparent anode, which is called "back emission".

For integrating the organic light emitting display, a controlled circuit, such as an active matrix utilizing thin film transistors (TFT), has to be arranged under the anode. In that case, the aperture ratio decreases as the OLED emits light from the anode. To solve the problem, a top emission construction of the OLED was proposed. FIG. 1 illustrates an active matrix OLED. The organic layer 106 is disposed between the transparent anode 108 and the transparent cathode 104. The cap layer 102 is disposed on the transparent cathode 104. The TFT 306 is coupled to the transparent anode 108 via the electronic connection unit 308 for controlling the light emitted from the organic layer 106.

However, light from the organic layer emits in all direction. If light is not emitted toward the transparent cathode, power is consumed and brightness of the OLED cannot be improved. A demand for an OLED with improved emission efficiency and brightness therefore derives.

SUMMARY OF THE INVENTION

One aspect of the present invention is improving emission efficiency and brightness of an OLED.

A top emission OLED having a reflective layer includes a substrate. On the substrate, a reflective layer, a first electrode, an organic layer, and a transparent second electrode are successively disposed. As a bias voltage is applied to the top emission OLED via the first electrode and the transparent second electrode, the organic layer emits radiation in all directions. The reflective layer reflects the radiation toward the transparent second electrode to increase brightness of the top emission OLED. In one embodiment, the first electrode and the transparent second electrode can be an anode and a cathode, respectively.

DETAILED DESCRIPTION OF THE INVENTION

The present invention provides an organic light emitting display (OLED) with improved emission efficiency and brightness. A reflective layer is disposed under an electrode, such as an anode, for reflecting light toward a transparent electrode, such as a cathode, so as to improve brightness of the top emission OLED.

Figure 1:
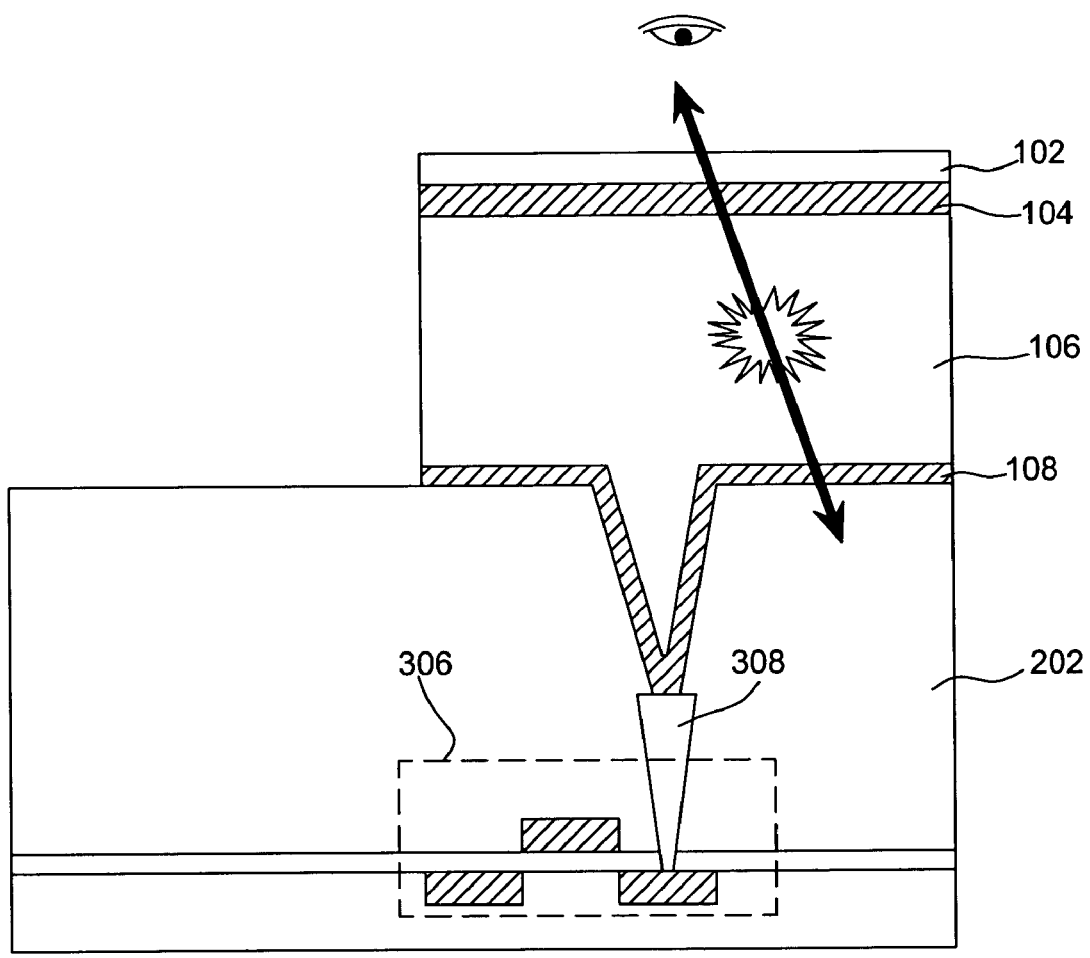
FIG. 1 is a cross-sectional view of a conventional OLED.
Figure 2:
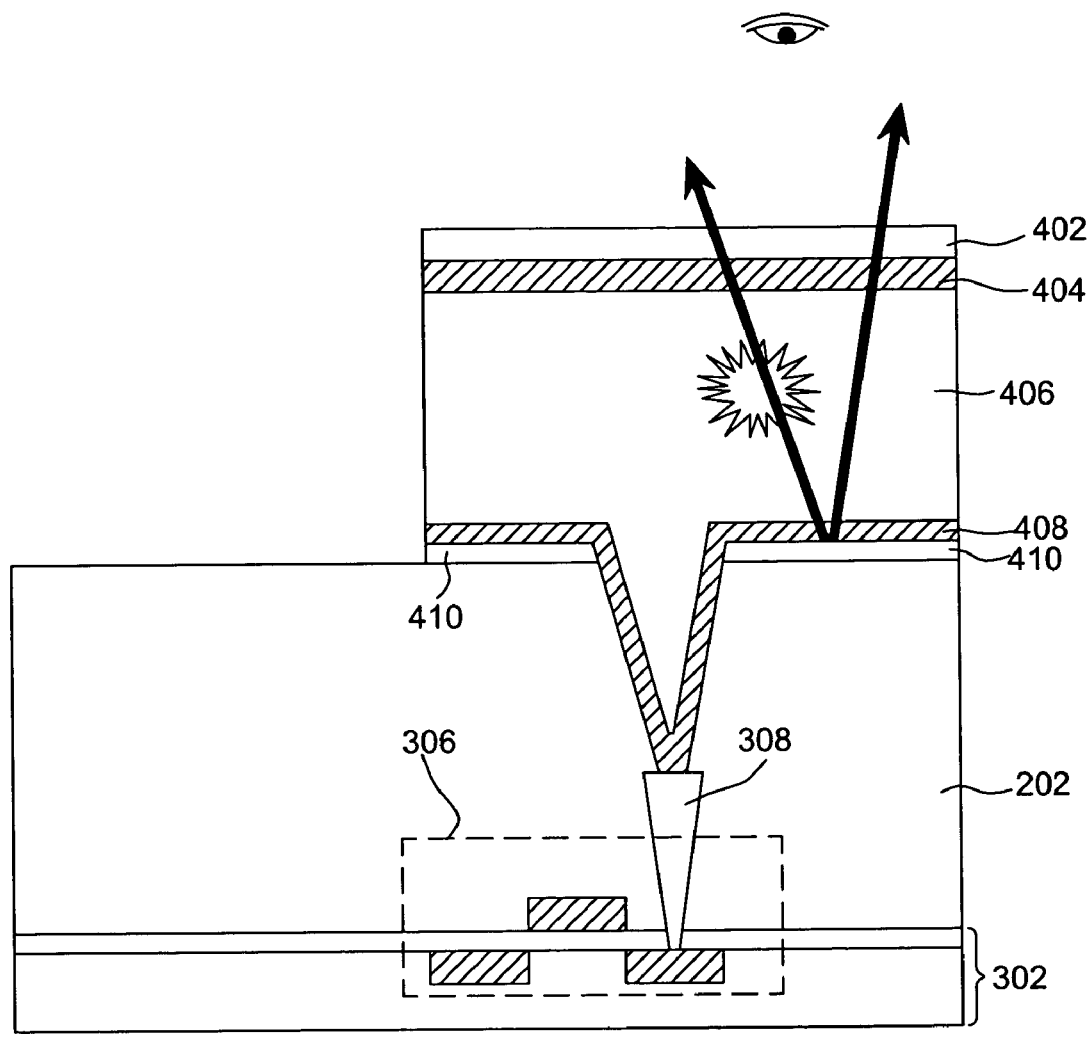
FIG. 2 is a cross-sectional view of an OLED in an exemplary embodiment of the present invention.

FIG. 2 is a cross-sectional view of an OLED in an exemplary embodiment of the present invention. A substrate 302 has a switch 306 disposed thereon. The switch 306 is electrically coupled to a first electrode 408, such as an anode, via the connection unit 308 for controlling the radiation of the top emission OLED. The switch 306 is preferably a thin film transistor (TFT). A planarization layer 202 is formed over the switch 306 and the substrate 302. The reflective layer 410 is disposed on the planarization layer 202, and material of the reflective layer 410 is preferably selected from a group consisting of aluminum, silver and their alloys. The first electrode (anode) 408 is disposed on the reflective layer 410 and is preferably made of ITO or IZO. An organic layer 406 is disposed on the first electrode 408. The organic layer 406 is preferably composed of a plurality of compound layers, and the plurality of compound layers may include an electronic layer, a hole transport layer and a light emitting layer. Disposed on the organic layer 406 is a transparent second electrode 404, such as a cathode, a thin metal film such as magnesium, aluminum or alloy thereof, or other transparent organic compounds with low work function. The transparent second electrode (cathode) 404 may have a cap layer 402 disposed thereon to protect the transparent second electrode 404.

In FIG. 2, as a bias voltage (not shown) is applied to the top emission OLED via the first electrode 408 and the transparent second electrode 404, the organic layer 406 emits radiation in all directions. The reflective layer 410 is disposed under the first electrode 408 and reflects the radiation toward the transparent second electrode 404, as shown by arrows. The reflective layer 410 is preferably made of material with high reflectance, such as silver, aluminum or alloy thereof. In this situation, most of the radiation from the organic layer 406 is emitted toward the transparent second electrode 404 and therefore brightness of the top emission OLED is increased. In the manufacture process, the reflective layer 410 and the first electrode 408 have the same pattern and the number of the masks in the process does not increase.

Figure 3:
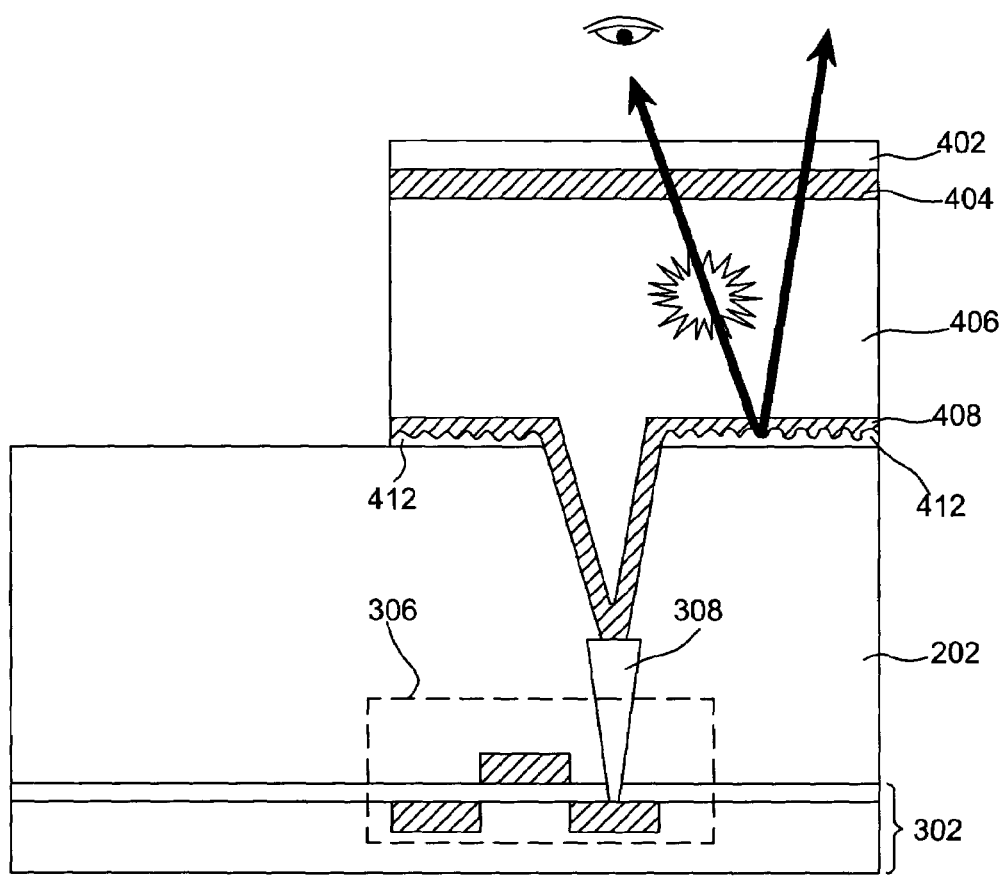
FIG. 3 is a cross-sectional view of an OLED in another exemplary embodiment of the present invention.

According to radiation characteristics, a contact surface between the reflective layer 410 and the first electrode 408 may be a plane surface, as shown in FIG. 2. The contact surface between the reflective layer 410 and the first electrode 408 can also be a rough surface, as shown in FIG. 3, to comply with different reflection characteristics of the top emission OLED. The top emission OLED in FIG. 3 is similar to that in FIG. 2, except that the contact surface between the reflective layer 410 and the first electrode 408 in FIG. 3 is the rough surface providing reflection characteristics different from those of the plane surface in FIG. 2. For example, the reflective layer 410 with a rough surface reflects the light emitted from the organic layer 406 more uniformly.

While this invention has been described with reference to illustrative embodiments, this description is not intended to be construed in a limiting sense. Various modifications of the illustrative embodiments, as well as other embodiments of the present invention, will be apparent to persons skilled in the art upon reference to this description. It is therefore contemplated that the appended claims will cover any such modifications or embodiments as falling within the true scope of the invention.

What is claimed is:

1. A top emission organic light emitting display (OLED), comprising:
   a substrate;
   a reflective layer disposed on the substrate;
   a first electrode disposed on the reflective layer, a contact surface between the reflective layer and the first electrode being a rough surface so as to reduce color shift with a wide viewing angle;
   an organic layer disposed on the first electrode; and
   a transparent second electrode disposed on the organic layer;
   wherein, as a bias voltage is applied to the top emission OLED via the first electrode and the transparent second electrode, the organic layer emits radiation in multiple directions, the reflective layer reflects the radiation toward the transparent second electrode.

2. The top emission OLED of claim 1, wherein the reflective layer is made of a material selected from a group consisting of aluminum, silver and alloy thereof.

3. The top emission OLED of claim 1, wherein the organic layer is composed of a plurality of compound layers, the plurality of compound layers comprise an electronic layer, a hole transport layer and a light emitting layer.

4. The top emission OLED of claim 1, further comprising a switch disposed between the substrate and the reflective layer, wherein the switch is electrically coupled to the first electrode for controlling the radiation of the top emission OLED.

5. The top emission OLED of claim 4, wherein the switch is a thin film transistor.

6. The top emission OLED of claim 1, further comprising a cap layer disposed on the transparent second electrode.

7. A top emission organic light emitting display (OLED), comprising:
   a substrate having a thin film transistor;
   a planarization layer disposed on the substrate covering the thin film transistor;
   a reflective layer disposed on the planarization layer;
   a first electrode disposed on the reflective layer and electrically coupled to the thin film transistor, a contact surface between the reflective layer and the first electrode being a rough surface so as to reduce color shift with a wide viewing angle;
   an organic layer disposed on the first electrode; and
   a transparent second electrode disposed on the organic layer;
   wherein, as a bias voltage is applied to the first electrode and the transparent second electrode, the organic layer emits radiation in all directions, the reflective layer reflects the radiation toward the transparent second electrode for increasing brightness of the top emission OLED.

8. The top emission OLED of claim 7, wherein the reflective layer is made of a material selected from a group consisting of aluminum, silver and alloy thereof.

9. The top emission OLED of claim 7, wherein the organic layer is composed of a plurality of compound layers, the plurality of compound layers comprise an electronic layer, a hole transport layer and a light emitting layer.

10. The top emission OLED of claim 7, further comprising a cap layer disposed on the transparent second electrode.

* * * * *